(12) United States Patent
Sommer

(10) Patent No.: US 7,002,222 B2
(45) Date of Patent: Feb. 21, 2006

(54) INTEGRATED SEMICONDUCTOR MEMORY CIRCUIT AND METHOD OF MANUFACTURING THE SAME

(75) Inventor: Michael Bernhard Sommer, Reubling (DE)

(73) Assignee: Infineon Technologies AG, Munich (DE)

(*) Notice: Subject to any disclaimer, the term of this patent is extended or adjusted under 35 U.S.C. 154(b) by 16 days.

(21) Appl. No.: 10/753,407

(22) Filed: Jan. 9, 2004

(65) Prior Publication Data

US 2005/0029602 A1 Feb. 10, 2005

(30) Foreign Application Priority Data

Jan. 10, 2003 (DE) .................................. 103 00 687

(51) Int. Cl.
*H01L 29/76* (2006.01)
*H01L 29/90* (2006.01)
*H01L 31/062* (2006.01)
*H01L 31/113* (2006.01)
*H01L 31/119* (2006.01)

(52) U.S. Cl. ............... 257/371; 257/204; 257/338; 257/351; 257/357; 257/369; 257/548; 257/549; 257/550

(58) Field of Classification Search ............... 257/204, 257/338, 351, 357, 369, 371, E27.064, E27.067, 257/E27.084, E27.108, 548, 549, 550
See application file for complete search history.

(56) References Cited

U.S. PATENT DOCUMENTS

| 5,043,788 A | * | 8/1991 | Omoto et al. ............... 257/371 |
| 5,290,714 A | * | 3/1994 | Onozawa .................... 438/207 |
| 5,291,052 A |   | 3/1994 | Kim et al. |
| 5,298,774 A | * | 3/1994 | Ueda et al. ................. 257/206 |
| 5,311,048 A | * | 5/1994 | Takahashi et al. .......... 257/207 |
| 5,323,043 A | * | 6/1994 | Kimura et al. .............. 257/371 |
| 5,378,906 A |   | 1/1995 | Lee |
| 5,457,064 A |   | 10/1995 | Lee |
| 5,726,475 A | * | 3/1998 | Sawada et al. ............. 257/369 |
| 6,130,840 A | * | 10/2000 | Bergemont et al. ..... 365/185.18 |
| 6,201,275 B1 | * | 3/2001 | Kawasaki et al. .......... 257/315 |
| 6,212,671 B1 | * | 4/2001 | Kanehira et al. ............. 716/19 |
| 6,310,815 B1 |   | 10/2001 | Yamagata et al. |
| 6,586,807 B1 | * | 7/2003 | Imato et al. ................ 257/401 |
| 6,703,670 B1 | * | 3/2004 | Lines ........................ 257/392 |

(Continued)

FOREIGN PATENT DOCUMENTS

DE           41 26 747           1/1993

(Continued)

*Primary Examiner*—Amir Zarabian
*Assistant Examiner*—Ida M. Soward
(74) *Attorney, Agent, or Firm*—Slater & Matsil, L.L.P.

(57) ABSTRACT

An integrated semiconductor circuit, having active components lying in mutually adjoining wells of a respective first and second conduction type, wherein the active components respectively are associated with substrate contacts lying in direct proximity to an edge bounding the mutually adjoining wells, is disclosed. Preferably, structures of the active components other than the contacts are arranged to lie further away from the edge and the circuit/layout structures are not mirror-symmetrical with respect to a center line of the circuit chip.

16 Claims, 3 Drawing Sheets

U.S. PATENT DOCUMENTS

| | | |
|---|---|---|
| 6,740,939 B1 * | 5/2004 | Sayama et al. ............. 257/371 |
| 6,791,147 B1 * | 9/2004 | Karasawa et al. .......... 257/371 |
| 6,853,037 B1 * | 2/2005 | Kudo et al. ................. 257/369 |
| 2002/0063297 A1 * | 5/2002 | Lee ............................ 257/371 |
| 2002/0175366 A1 * | 11/2002 | Lotfi et al. .................. 257/335 |
| 2003/0025124 A1 * | 2/2003 | Deboy ........................ 257/119 |
| 2003/0042548 A1 * | 3/2003 | Maeda et al. ............... 257/369 |
| 2003/0102512 A1 * | 6/2003 | Chatterjee ................... 257/370 |
| 2004/0026743 A1 * | 2/2004 | Shibata et al. ............. 257/368 |
| 2005/0079676 A1 * | 4/2005 | Mo et al. .................... 438/268 |

FOREIGN PATENT DOCUMENTS

| | | |
|---|---|---|
| DE | 42 38 801 | 9/1993 |
| DE | 198 37 016 | 5/1999 |

* cited by examiner

PRIOR ART

INTEGRATED SEMICONDUCTOR MEMORY CIRCUIT AND METHOD OF MANUFACTURING THE SAME

BACKGROUND

Field of the Invention

The present invention relates generally to integrated semiconductor circuits.

BACKGROUND INFORMATION

The implantation of n- and p-conducting wells in a semiconductor substrate gives rise to parameter fluctuations of the structures of the active components formed in the wells, such as transistors, for example, which stem from so-called "well scattering". Said well scattering occurs since, on account of the channeling effect, the ion beam, which brings about the implantation, is radiated in at a certain angle, namely not perpendicularly to the wafer surface, so that a bombardment angle parallel to the crystal planes is avoided. However, the consequence of said angle is that the ion beam is scattered at an edge formed by a step.

The effect of this scattering phenomenon is illustrated with reference to the accompanying FIG. 1. FIG. 1 diagrammatically shows a section at the surface of a semiconductor wafer in which an implantation is carried out by means of an ion beam B incident at an irradiation angle α. Said implantation is performed into a well 11, which is an n-doped well, for example. An adjacent region, for example a p-doped well 12, is covered by a photoresist layer 3, the left-hand edge of which defines a boundary G-depicted in dash-dotted fashion-between well region 11 and the adjacent well region 12.

Due to the required irradiation angle α, the ion beam B is scattered at the sidewall of the photoresist 3. However, the consequence of the scattering of the ion beam B during the well implantation is that an additional, undesired and uncontrollable doping takes place at the substrate surface, as indicated by the lower pair of arrows originating at the left edge of photoresist 3 and terminating at a region 2. If this undesirable scattering of ion beam B at the sidewall of photoresist 3 contaminates region 2 of an active component, such as an FET, the affected transistor (and other components affected by this undesirable implantation contamination) may behave completely differently than the manner envisaged by the design and revealed by simulation. This leads to functional problems for the semiconductor circuit.

The problem outlined above has previously been solved by maintaining sufficient distance between the boundary G and active regions in the implanted well, such as region 2. That is to say, the active components have been positioned far enough away from the scattering beam. However, problems occur to an increased extent as feature sizes become increasingly smaller, as revealed in reduced fabrication yield and reduced device quality. In order to provide a remedy, so-called "quad implants" have been used specifically in the DRAM fabrication process. Thus, each individual memory bank has been individually implanted with a respectively alternating irradiation direction of the ion beam. The consequence of this is that the well implantation step has been divided into four steps and the costs for this step have thereby increased fourfold. However, the "quad implant" used makes it possible for the scattering to be produced only at the well edges which are the least critical.

The fabrication of DRAM semiconductor memory modules represents a very important application of well implantation. An explanation is given below, with reference to FIGS. 2A and 2B, of a basic structure of known DRAM semiconductor memories, and the associated problem of well scattering.

FIG. 2A shows a diagrammatic plan view of a small section of a DRAM 10. Situated on both sides of a line of symmetry S, which is indicated by a simple dashed line and runs horizontally in FIG. 2A, are mutually adjoining p-type and n-type wells 12, 11, whose layout/circuit structures are mirror-symmetrical with respect to the axis of symmetry S. In FIG. 2A, this is illustrated, for example, by the fact that mutually corresponding p-type wells 12 which are designated as a1, are arranged symmetrically with respect to the axis of symmetry S. The reason for this symmetry resides in the simple layout generation, or is historical. Consequently, the memory cells are produced by a mirroring process in a simple manner. The disadvantage of this mirroring process is illustrated by way of reference to a circuit structure at a side of the p-type well 12 which is designated by a1. If an a1 structure is exposed to a scattering radiation, brought about by an obliquely incident ion beam B, on one side of chip 10, the circuit a1 on the other side of the chip is not similarly exposed. The consequence of this fact is that the chip halves lying on opposite sides of the line of symmetry S are processed differently and, consequently, cannot be made identical.

To illustrate the above-outlined problem in further detail, a view from FIG. 2A is depicted diagrammatically in FIG. 2B. Two wells, namely an n-type well 11 and a p-type well 12, lie next to one another and are separated by a boundary labeled with G1 at the top of the figure and with G2 at the bottom of the figure. As already described with reference to FIG. 1, during the implantation of n-type well 11, p-type well 12 is covered by a WP resist 3. Due to the scattering radiation at the edge of the WP resist layer, in the manner outlined above, the active components are doped undesirably and influenced in a harmful manner in an edge region 13 of n-type well 11 which faces side a2 of p-type well. In the example illustrated with reference to FIGS. 2A and 2B, the undesirable doping applies to the active structures in n-type well 11 that lie below the line of symmetry S in the drawing, but, on account of the symmetry property, not to the corresponding active circuit structures in an n-type well 11 lying above the line of symmetry S.

In a similar fashion, during the implantation of p-type wells 12, n-type well 11 is covered by a WP resist, and during the implantation of the p-type well, well scattering adversely influences the corresponding active components in the p-type wells 12 on one side only of the line of symmetry S.

In light of the forgoing discussion, it is clear that a need exists to improve implantation processes, particularly as applied to DRAM memory fabrication.

SUMMARY

Consequently, it is an object of the invention to avoid the above-described problem in the fabrication of an integrated semiconductor circuit, in particular semiconductor memory circuit, and to enable such an integrated semiconductor circuit, in particular semiconductor memory circuit, in such a way that no harmful influencing of the parameter values of the active components occurs during the well implantation and, as a result, the reliability and service life of such an integrated semiconductor circuit is increased and the fabrication costs are reduced.

In an embodiment of the present invention, an integrated semiconductor circuit, in particular a semiconductor memory circuit, includes substrate contacts of the active components arranged to lie in direct proximity to an edge bounding the mutually adjoining wells, and further includes other structures of the active components arranged to lie further away from said edge. Furthermore, according to an exemplary embodiment of the present invention, in an integrated semiconductor circuit comprising the aforementioned arrangement of substrate contacts and other structures, the circuit/layout structures are not configured mirror-symmetrically with respect to the center line of the semiconductor circuit chip.

In a DRAM semiconductor circuit according to another exemplary embodiment of the present invention, a p-doped well and an n-doped well are mutually adjoining, with the active components in the p-doped well having n-channel FETs and the active components in the n-doped well having p-channel FETs. Furthermore, the substrate contacts of the n-channel FETs in the p-doped well and the substrate contacts of the p-channel FETs in the n-doped well lie in direct proximity to a boundary between the two mutually adjoining wells.

In another embodiment of the present invention, a method for fabricating an integrated semiconductor circuit, in particular a semiconductor memory circuit, includes ion beam implantation with a specific irradiation angle oblique with respect to the crystal planes of the substrate. Further included is the use of ion beam implantation to implant mutually adjoining wells of a respective first and second conduction type in a substrate, as well as formation of active components and respective substrate contacts in the wells. In a preferred embodiment, the substrate contacts of the active components are formed in direct proximity to an edge between the mutually adjoining wells, while the other structures of the active components in the mutually adjoining wells are formed further away from said edge.

The above and further advantageous features are explained in more detail with reference to the drawings in the description below of exemplary embodiments of an integrated semiconductor circuit, which relates by way of example to a DRAM memory circuit.

DETAILED DESCRIPTION OF THE INVENTION

Figure 1:
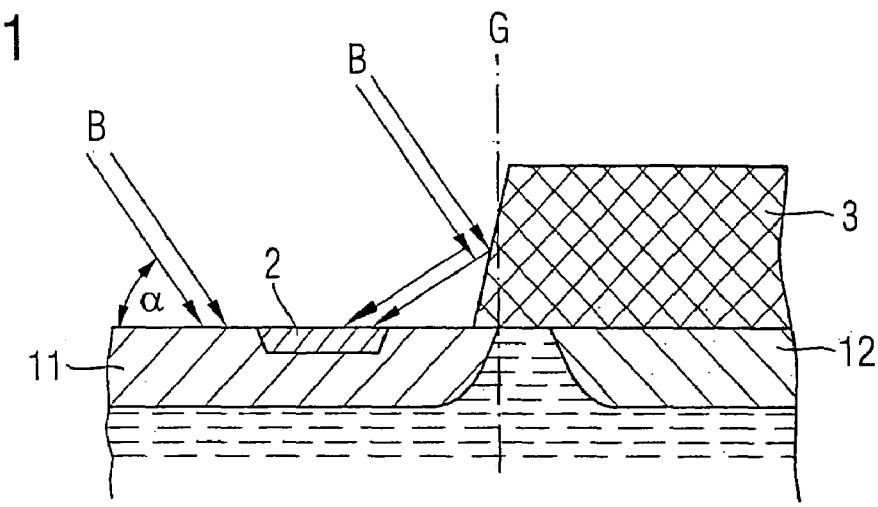
FIG. 1 illustrates a diagrammatic cross through an integrated semiconductor circuit for elucidating the "well scattering" phenomenon.

The following list of symbols is used consistently throughout the text and drawings.
2 Active transistor region
3 Photoresist
10 DRAM chip
11 n-type well
12 p-type well
13 Critical region of the n-type well
15 n-FETs
16 p-FETs
17 Contacts with respect to the p-type well
18 Contacts with respect to the n-type well
G, G1, G2 Boundary between p-type and n-type well
B Ion beam
M Center line
S Line of symmetry
α Irradiation angle of the ion beam
a1, a2 Side regions of the p-type wells 12 that are occupied by the same circuit structures In an embodiment of the present invention, a circuit/layout arrangement is altered from that of the conventional DRAM design, in conjunction with a "design rule" change. In a preferred embodiment, substrate contacts or bulk terminals are positioned in direct proximity to the edges, which scatter the implanting ion beam. One consequence of this arrangement is that the scattering implantation can even be utilized in a positive manner. In an exemplary embodiment, the contact implantation of the bulk terminals is thereby improved.

Preferably, the circuit/layout mirroring process heretofore employed in DRAM design is replaced by a non-mirror layout to avoid problems associated with implantation of mirror-symmetric chips discussed above.

Figure 2A:
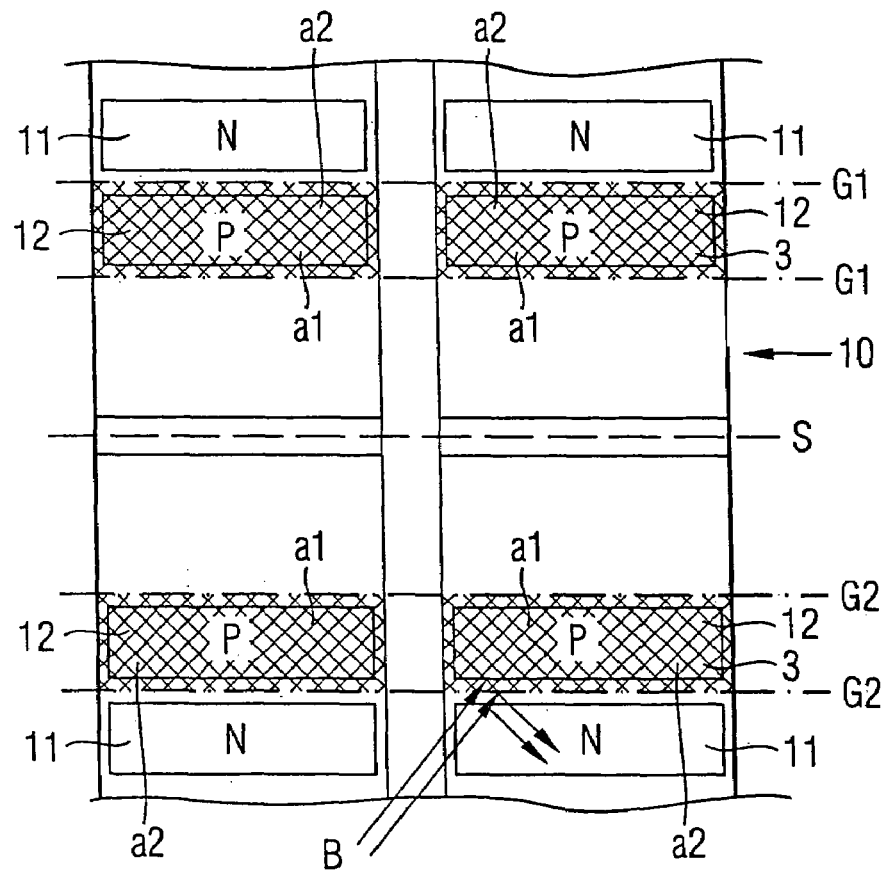
FIGS. 2A and 2B illustrate a plan view of essential circuit blocks of a known DRAM memory chip.
Figure 3:
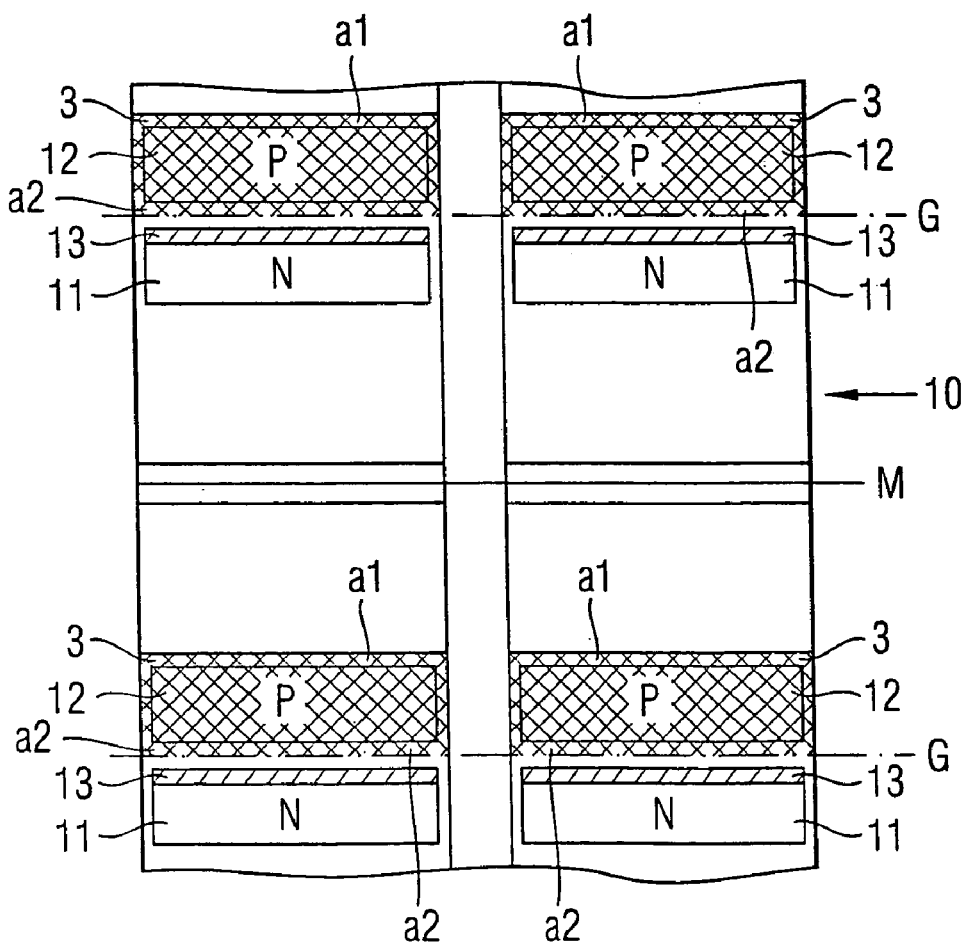
FIG. 3 illustrates a plan view of circuit blocks of a DRAM memory configured according to an exemplary embodiment of the present invention.

FIG. 3 diagrammatically shows a plan view with blocks of a DRAM memory chip 10 according to an exemplary embodiment of the present invention. In comparison with FIG. 2A, which shows a similar plan view of a section of a known DRAM memory chip, in the case of the DRAM chip 10 shown in FIG. 3, the circuit structures are not formed symmetrically with respect to the horizontal center line M. The n-type wells 11 all lie on the same side of the p-type wells 12. Moreover, by way of example referring to the p-type wells 12, the mutually corresponding sides a1, which designate the same circuit structures in the wells, all point in one direction, and the other mutually corresponding sides a2 of the same well point in the opposite direction. A similar arrangement applies to the n-type wells 11. During the implantation of n-type wells 11 by means of ion beam B, which is incident at a specific angle, no well scattering occurs since the n-type wells all lie on one side, that is to say, on the side of the p-type wells at which no scattering of the ion beam B takes place.

FIG. 3 also illustrates regions 13 in n-type wells 11, which adjoin the well boundaries G, and to which now, according to the above-described arrangement, are no longer critical with regard to the active components.

In an exemplary embodiment of the present invention, during implantation of p-type wells 12, the irradiation angle of ion beam B is altered or the wafer is rotated through 180°, such that the ion beam B is no longer scattered at the edges of the photoresist (which then covers the n-type wells) opposite the p-type wells.

Figure 2B:
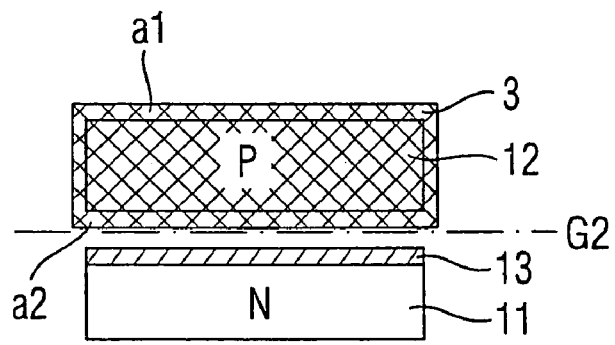
Figure 4:
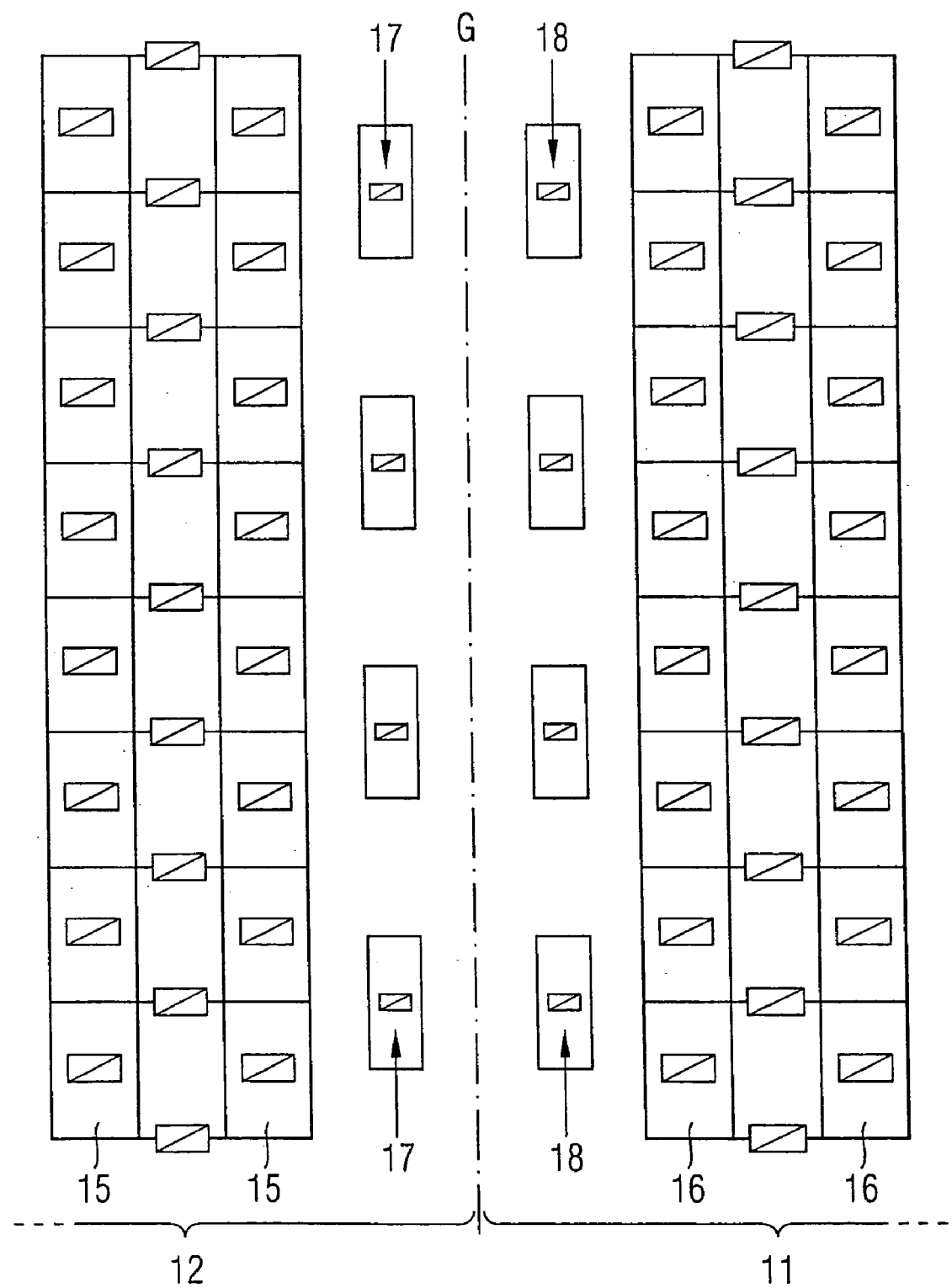
FIG. 4 illustrates a plan view showing an enlarged view of a portion of the DRAM memory chip depicted in FIG. 3, including a region where wells adjoin one another at a boundary G, according to an embodiment of the present invention.

It has been explained above with reference to FIG. 3, in comparison with FIGS. 2A and 2B, on the basis of a DRAM memory circuit configured according to an embodiment of the present invention, that the mirror symmetry of the circuit structure and layout with respect to the center line M is canceled. As already mentioned, not only is the harmful effect of the scattering implantation avoided by the layout and the circuit structures no longer being mirror-symmetrical, but scattering implantation that nevertheless occurs, is utilized in a positive fashion by placing the substrate or bulk contacts in direct proximity to the boundary G between the two mutually adjoining wells 11 and 12. The scattering implantation improves the contact implantation of the substrate or bulk terminals. This is illustrated in FIG. 4, which depicts an enlarged plan view of a region of p-type well 12 and n-type well 11, on opposite sides of boundary G. In an exemplary embodiment, the numerals 17 and 18 designate substrate contacts of n-FETs 15 lying in p-type well 12, and p-FETs lying in n-type well 11, respectively. In a further exemplary embodiment, the numerals 17 and 18 designate bulk contacts of n-FETs 15 lying in p-type well 12, and p-FETs lying in n-type well 11, respectively. In both of the above embodiments, the contacts 17 and 18 are positioned in direct proximity to the boundary G between the two wells 11 and 12. The other structures of the active components lie further away from edge G. Therefore, in a preferred embodiment of the present invention, a necessary design rule change is implemented, which recognizes whether an active circuit structure, for example an FET, is sufficiently far away from boundary line G. By contrast, the substrate or bulk contacts 17 and 18 are intended to lie near to the well edge G in order thereby to improve the contact implantation of the substrate or bulk contacts.

In the above exemplary embodiment, integrated semiconductor circuits have been described by way of example on the basis of a DRAM semiconductor circuit. However, the principle of the invention can also be applied to other integrated semiconductor circuits, for example, when the intention is to avoid the harmful effect of the scattering implantation during well implantation by means of an ion beam in two adjacent wells occupied by active components.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A semiconductor device comprising:
a plurality of wells of a first conduction type, each well formed in a substrate and containing a first set of active components and a first set of contacts associated with the first set of active components; and
a plurality of wells of a second conduction type, each well formed in a substrate and containing a second set of active components and a second set of contacts associated with the active components,
wherein the wells of the first conduction type share a mutually adjoining boundary with the wells of the second conduction type, the mutually adjoining boundary disposed within a border region, wherein a contamination zone due to implantation scattering during well implantation lies within the border region;
wherein the first set of contacts and second set of contacts lie in the border region near the mutually adjoining boundary, and
wherein the active components lie further away from the mutually adjoining boundary than do the first and second set of contacts.

2. The semiconductor device of claim 1, wherein the device comprises a memory chip.

3. The semiconductor device of claim 1, wherein the active components lie outside the border region.

4. The semiconductor device of claim 1, wherein the wells of the first conduction type and the wells of the second conduction type are arranged in a circuit layout structure that is not mirror-symmetrical with respect to a center line therein.

5. The semiconductor device of claim 4, wherein the wells of the first conduction type are p-type, and each include at least one n-channel FET fabricated thereon, and
wherein the wells of the second conduction type are n-type, and include at least one p-channel FET fabricated thereon.

6. A semiconductor chip comprising:
a plurality of pairs of wells, each pair including an n-type well adjacent to a p-type well, wherein a border region is defined along an edge where each n-well and p-well are mutually adjacent;
a set of contacts within each well arranged to lie within the border region; and
a set of active components within each well arranged to lie outside the border region;
wherein the arrangement of the pairs of wells is such that there is no mirror symmetry of the well location with respect to a line through the center of the chip; and
wherein a contamination zone due to implantation scattering during well implantation lies within the border region within each pair of wells.

7. The semiconductor chip of claim 6, wherein the semiconductor chip comprises a memory chip.

8. The semiconductor device of claim 7, wherein the memory chip comprises a DRAM chip.

9. The semiconductor device of claim 8, wherein the wells of the first conduction type and the wells of the second conduction type are arranged in a circuit layout structure that is not mirror-symmetrical with respect to a center line therein.

10. The semiconductor device of claim 9, wherein the wells of the first conduction type are p-type, and each include at least one n-channel FET fabricated thereon, and
wherein the wells of the second conduction type are n-type, and include at least one p-channel FET fabricated thereon.

11. The semiconductor chip of claim 7, wherein the semiconductor chip comprises a DRAM chip.

12. A semiconductor device comprising:
a plurality of pairs of wells, each pair including an n-type well adjacent to a p-type well, wherein a border region is defined along an edge where each n-well and p-well are mutually adjacent, wherein a contamination zone due to implantation scattering during well implantation lies within the border region within each pair of wells;

at least one contacts within each well arranged to lie within the border region; and at least one active component within each well arranged to lie outside the border region.

13. The device of claim 12, wherein the semiconductor device comprises a memory chip.

14. The device of claim 13, wherein the semiconductor device comprises a DRAM chip.

15. The device of claim 12, wherein no active components lie within the border region within each well.

16. The device of claim 12, wherein the pairs of wells are arranged such that there is no mirror symmetry of the well location with respect to a line through the center of a region that includes the wells.

* * * * *